US006785837B1

(12) United States Patent
Kilmer et al.

(10) Patent No.: US 6,785,837 B1
(45) Date of Patent: Aug. 31, 2004

(54) FAULT TOLERANT MEMORY SYSTEM UTILIZING MEMORY ARRAYS WITH HARD ERROR DETECTION

(75) Inventors: Charles Arthur Kilmer, Essex Junction, VT (US); Shanker Singh, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 550 days.

(21) Appl. No.: 09/716,916

(22) Filed: Nov. 20, 2000

(51) Int. Cl.[7] .................................................. G06F 11/00
(52) U.S. Cl. .......................................... 714/7; 714/733
(58) Field of Search ............................ 714/7, 6, 13, 27, 714/30, 42, 56, 735, 736, 733, 764, 47

(56) References Cited

U.S. PATENT DOCUMENTS

| | | | |
|---|---|---|---|
| 4,661,955 A | | 4/1987 | Arlington et al. |
| 4,862,462 A | | 8/1989 | Zulian et al. |
| 5,058,115 A | | 10/1991 | Blake et al. |
| 5,291,498 A | * | 3/1994 | Jackson et al. .............. 714/758 |
| 5,450,423 A | | 9/1995 | Iwasaki et al. |
| 5,471,479 A | | 11/1995 | McRoberts et al. |
| 5,528,553 A | * | 6/1996 | Saxena ................... 365/230.01 |
| 5,734,664 A | | 3/1998 | Saxena |
| 5,751,740 A | | 5/1998 | Helbig, Sr. |
| 5,751,744 A | * | 5/1998 | Babb .......................... 714/800 |
| 5,781,568 A | | 7/1998 | Hsieh |
| 5,845,059 A | * | 12/1998 | McClure ....................... 714/27 |
| 5,886,930 A | * | 3/1999 | Maclellan et al. ...... 365/189.05 |
| 5,917,838 A | * | 6/1999 | Wardrop ...................... 714/767 |
| 6,085,334 A | * | 7/2000 | Giles et al. ..................... 714/7 |

* cited by examiner

Primary Examiner—Nadeem Iqbal
(74) Attorney, Agent, or Firm—Randall J. Bluestone; Dillon & Yudell LLP (57) ABSTRACT

A fault tolerant memory system and method of operation thereof. The fault tolerant memory system includes a number of memory arrays including at least one spare memory array, wherein each of the memory arrays has an internal error detection circuit. In an advantageous embodiment, the internal error detection circuit includes an inverter, a register coupled to the inverter and a comparator for comparing the contents of the inverter and register. The comparator will generate an error signal to indicate a failed memory array in response to the contents of the inverter and register not being equal. The fault tolerant memory system also includes data correction logic that corrects data stored in a failed memory array and, in an advantageous embodiment, restores "corrupted" data in a failed array by reading the content of a row of cells in the failed memory array and generating a first complement of the content. Next, the first complement is written back to the row of cells, following which, the first complement is again read from the failed memory array and a second complement of the first complement is generated to restore the corrupted data to its original "uncorrupted" form. The fault tolerant memory system further includes a replacement circuit for replacing the failed memory array with a spare array.

21 Claims, 5 Drawing Sheets

FAULT TOLERANT MEMORY SYSTEM UTILIZING MEMORY ARRAYS WITH HARD ERROR DETECTION

CROSS REFERENCE TO RELATED APPLICATIONS

The present application is related to the following copending U.S. patent aplication Ser. No. 09/716,915 filed concurrently on Nov. 20, 2000, entitled "METHOD AND SYSTEM FOR DETECTING A HARD FAILURE IN A MEMORY ARRAY" and U.S. patent application Ser. No. 09/716,913 filed concurrently on Nov. 20, 2000 entitled "A HIGH PERFORMANCE FAULT TOLERANT MEMORY SYSTEM UTILIZING GREATER THAN FOUR-BIT DATA WORD MEMORY ARRAYS." The above-mentioned patent applications are assigned to the assignee of the present application and are herein incorporated in their entirety by reference.

BACKGROUND OF THE INVENTION

1. Technical Field

The present invention relates in general to memory configurations for computing systems, and in particular to fault detection. More specifically, the present invention relates to a fault tolerant memory system utilizing memory arrays with hard error detection and a method of operation thereof.

2. Description of the Related Art

Memory systems employed in conventional data processing systems, such as computer systems, typically include large arrays of physical memory cells that are utilized to store information in a binary manner. Generally in a conventional memory system, all of the memory cells on a memory chip are disposed in one or more memory arrays having a set number of rows and columns. Operatively, the rows are selected by row decoders that are typically located adjacent to the ends of the row lines. Each of the row lines is electrically connected to the row decoders so that the appropriate signals can be received and transmitted.

The columns of the memory array are connected to input/output (I/O) through column decode devices. In the case of dynamic random access memories (DRAMs), the memory array columns are also connected to line precharging circuits and sense amplifiers at the end of each column line to periodically sense amplify and restore data in the memory cells.

There are two kinds of errors that can typically occur in a memory system, soft errors and hard errors. A soft error is a seemingly random inversion of stored data. This inversion may be caused by occasional electrical noise, environmental conditions and, in some cases, by bombardment of radioactive particles, the so-called alpha particle event. The soft error problem has increased as the individual cell sizes of the memory arrays have been reduced increasing their susceptibility to relatively low amounts of noise. Although soft error failure rates are generally 2–3 times the order of magnitude higher than hard error failure rates in DRAM arrays, soft error failures typically only cause single bit errors in memory system words. A hard error, in contrast, represents a permanent electrical failure of the memory array, often restricted to particular memory locations but may also sometimes associated with peripheral circuitry of the memory array so that the entire array can be affected. Naturally, designers of memory arrays have strived to reduce the occurrence of both hard and soft errors in their memory arrays.

One solution for detecting and correcting both hard and soft errors has been the implementation of error correction codes (ECC) in large computer memories. The fundamentals of error detecting and correcting are described by R. W. Hamming in a technical article entitled "Error Detecting and Error Correcting Codes" appearing in the Bell System Technical Journal, Volume 26, No. 2, 1950 at pages 147–160. Utilizing one of the most popular Hamming codes, an 8-bit data word is encoded to a 13-bit word according to a selected Hamming code. A decoder can process the 13-bit word and correct any 1 bit error in the 13 bits and can detect if there are 2-bit errors. The described code, thus, is classified as SEC/DED (single error correct/double error detect). The use of such codes has been particularly efficient for memory arrays having single-bit outputs. For instance, if a relatively simple computer were to have 16K (16,348) bytes of data where each byte contains 8 data bits, an efficient error-protected design would utilize thirteen 16K×1 memory arrays with the extra five 16K memory arrays providing a Hamming SEC/DED protection. The Hamming code not only can correct a single bit hard or soft random error occurring in any byte, but can also further correct any one failed 16K memory array since any one memory array contributes only 1 bit per each error-protected word.

The above-described 13-bit Hamming code can only correct one error, whether it is a hard error or a soft error. Consequently, if one memory array has suffered a hard failure in all its locations, then the remaining memory arrays are not protected against an occasional soft error although it could be detected but not corrected. To be able to detect and correct more than one error, more elaborate error correcting codes have been developed and implemented. However, as a general rule, the more errors that can be corrected in a word, the more extra check bits are required by the check code.

Presently, memory arrays typically contain 256 Mbit devices and the trend is towards production of memory arrays that will contain 1 Gbit within two to four years. With the anticipated increase in memory array sizes, the present approach of utilizing 1 or 4-bit wide memory chip organization must be reconsidered. For example, employing the present 1 or 4 bit memory chip organization with a 32 bit wide data word will require 32 memory arrays (1 bit organization) or 8 memory arrays (4 bit organization). This will, in turn, result in a minimum granularity, e.g., in a personal computer (PC), of 8 GB or 2 GB, respectively. This large amount of memory in a desktop or laptop computer is excessive and also has the added disadvantage of increasing the overall cost of the computer system. In response to the minimum granularity problem, memory array manufacturers are moving to 8, 16 and even 32 bit wide memory organization schemes with the corresponding increase in the number of check bits required for error detection and correction.

Unfortunately, Hamming codes require several check bits to accomplish the error detection and correction. As discussed above, an eight-bit data word requires five check bits to detect two-bit errors and correct one-bit errors. As the bus grows wider and the number of bits of transmitted data increases, the number of check bits required also increases. Because modern memory buses are often 64 or 128 bits wide, the associated Hamming code would require substantially more check bits and increasing levels of logic circuits to implement the error correction. Consequently, using powerful Hamming codes in large memory systems is expensive and consumes substantial memory resources.

Accordingly, what is needed in the art is an improved error detection and correction scheme that mitigates the above-described limitations in the prior art.

SUMMARY OF THE INVENTION

It is therefore an object of the invention to provide an improved memory system.

It is another object of the invention to provide a fault tolerant memory system utilizing memory arrays with hard error detection and a method of operation thereof.

To achieve the foregoing objects, and in accordance with the invention as embodied and broadly described herein, a fault tolerant memory system is disclosed. The fault tolerant memory system includes a number of memory arrays including at least one spare memory array, wherein each of the memory arrays has an internal error detection circuit. In an advantageous embodiment, the internal error detection circuit includes an inverter, a register coupled to the inverter and a comparator for comparing the contents of the inverter and register. The comparator will generate an error signal to indicate a failed memory array in response to the contents of the inverter and register not being equal. The fault tolerant memory system also includes data correction logic for correcting data stored in a failed memory array and, in an advantageous embodiment, restores "corrupted" data in a failed array by reading the content of a row of cells in the failed memory array and generating a first complement of the content. Next, the first complement is written back to the row of cells, following which, the first complement is again read from the failed memory array and a second complement of the first complement is generated to restore the corrupted data to its original "uncorrupted" form. The fault tolerant memory system further includes means for replacing the failed memory array with a spare array.

The present invention discloses a novel fault tolerant (highly reliable) memory system utilizing memory arrays with greater than four-bit wide organization and internal error detection capabilities. The utilization of widely organized memory arrays with internal error detection capabilities allows a memory system to utilize a minimum number of memory arrays to satisfy small memory granularity requirements. The memory system of the present invention provides the minimum granularity and high performance that are required for devices such as personal computers, laptop and other small hand-held information devices.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structure for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
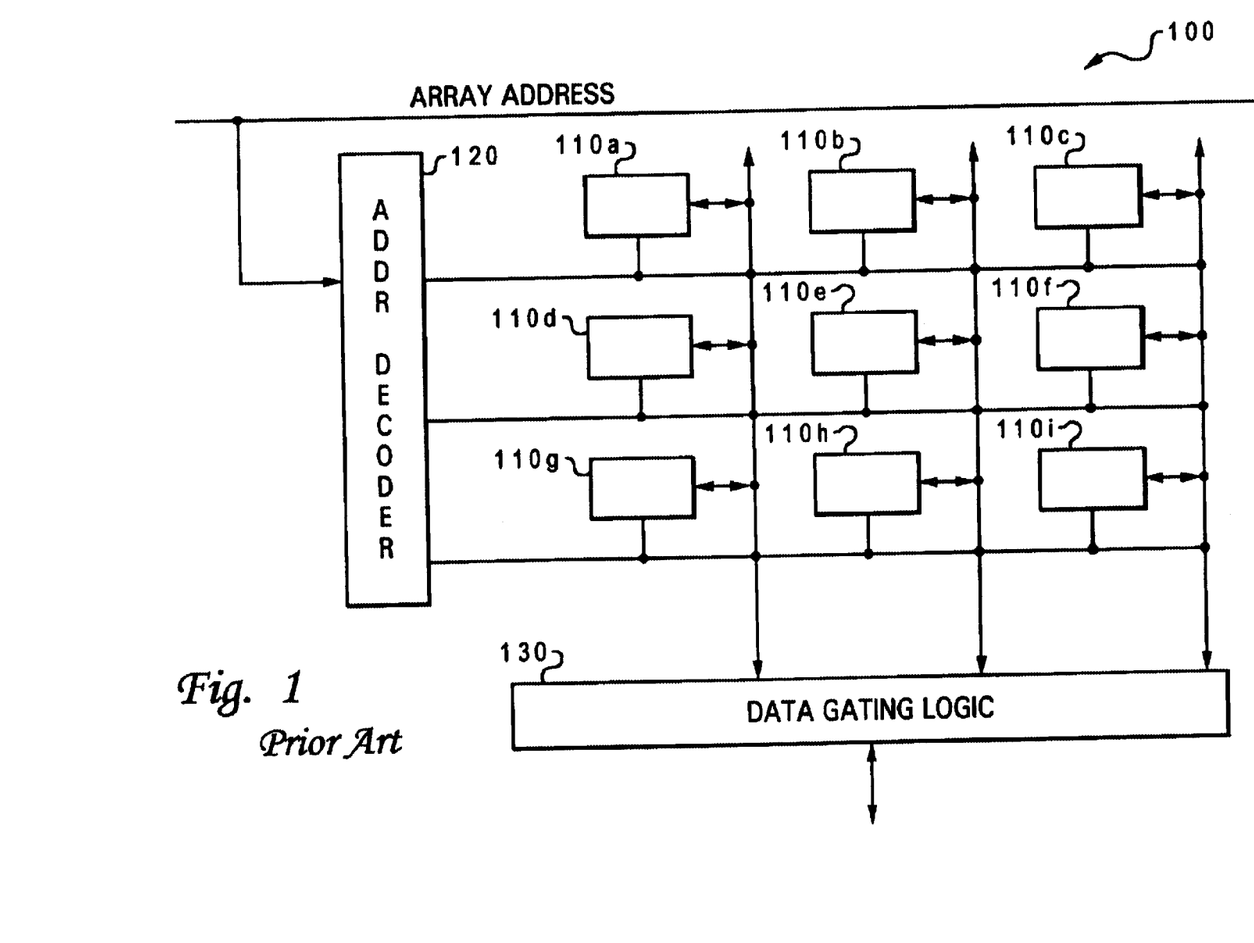
FIG. 1 illustrates an exemplary high-level simplified block diagram of a memory system that provides a suitable environment for the practice of the present invention.

With reference now to the figures and in particular with reference to FIG. 1, there is depicted an exemplary high-level simplified block diagram of a memory system 100 that provides a suitable environment for the practice of the present invention. Memory system 100 includes a plurality of memory arrays, generally designated 110$a$–110$i$, that are coupled to a corresponding address decoder 120 that is utilized to selectively couple a desired stored data word location identified by a specific row and column in memory arrays 110$a$–110$i$ to a data gating logic 130. Memory arrays 110$a$–110$i$, in a preferred embodiment, are dynamic random access memories (DRAMs). In an advantageous embodiment, memory system 100 is part of a data processing system, such as a personal computer (PC).

Generally, memory system 100 receives three external signals: one clock (not shown) and two commands, i.e., READ and WRITE. Memory system 100 also receives a multi-bit address signal at address decoder 120 and may, for example, generate a multiple bit output at data gating logic 130 at every 1 ns clock cycle (assuming a gigahertz clock is utilized). The address of a data word to be read, or alternatively written, is received at address decoder 120 that, in turn, generates the corresponding row and column addresses in memory arrays 110$a$–110$i$. Data gating logic 130 generally contains all the logic circuits, such as a read/write multiplexer, for transferring the information stored in the memory arrays to a data in/out buffer (not shown).

Figure 2:
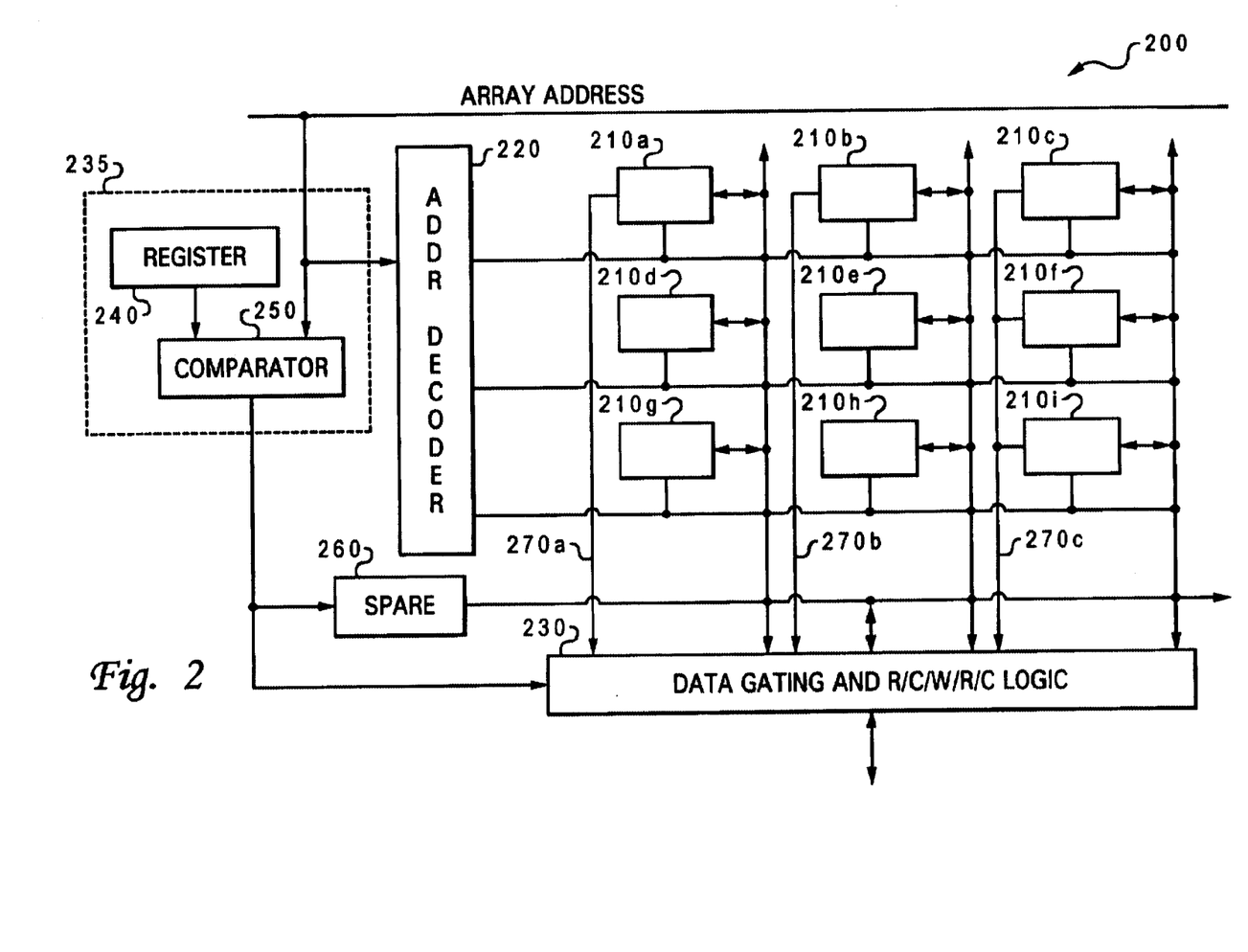
FIG. 2 illustrates a simplified block diagram of an embodiment of a fault tolerant memory system constructed according to the principles of the present invention.

Referring now to FIG. 2, there is illustrated a simplified block diagram of an embodiment of a fault tolerant memory system 200 constructed according to the principles of the present invention. Fault tolerant memory system 200 includes a plurality of memory arrays, generally designated 210$a$–210$i$, that are coupled to a corresponding address decoder 220 that is utilized to selectively couple a desired stored data word location identified by a specific row and column in memory arrays 210$a$–210$i$ to a data gating and a data correction, i.e., R/C/W/R/C (read-complement-write-read-complement), logic 230. Fault tolerant memory system 200 also includes a spare memory array 260 that, in an advantageous embodiment, is similar in size and construction to memory arrays 210$a$–210$i$. Spare memory array 260 is coupled to data gating logic 230 and a replacement circuit 235 that includes a comparator 250 and a register 240. Each of memory arrays 210$a$–210$i$ have internal hard failure or "chipkill" detection logic to generate an error detection signal when the memory array has incurred a hard error. These chipkill signals are shown in the illustrated embodiment as first, second and third error signal lines 270$a$, 270$b$, 270$c$ coupled to data gating and R/C/W/R/C logic 230. The construction and operation of an exemplary memory array with chipkill detection will hereinafter be described in greater detail with respect to FIGS. 3 and 4.

Figure 3:
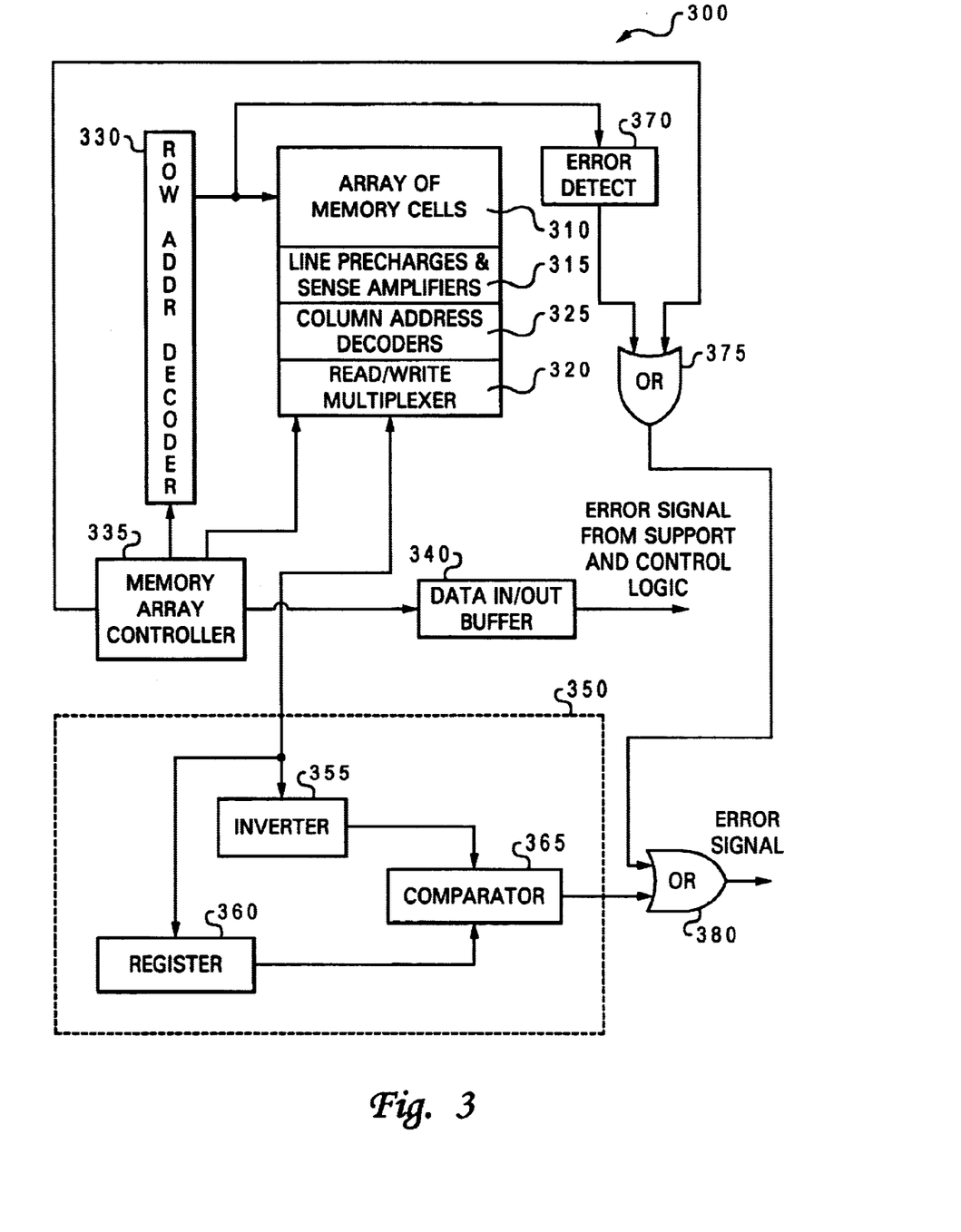
FIG. 3 illustrates a block diagram of an embodiment of an exemplary memory array with chipkill detection.

Referring now to FIG. 3, there is illustrated a block diagram of an embodiment of an exemplary memory array 300 with chipkill detection. Memory array 300 (analogous to memory arrays 210a–210i depicted in FIG. 2) includes a plurality of memory cells, generally designated 310, that are typically organized in an array fashion of rows and columns. Memory array 300 also includes line precharges and sense amplifiers 315 that are coupled to the end of end column of memory cells and are utilized to precharge a bitline (not shown). A memory array controller 335 controls the selection of which memory cells that are to be read or written through row and column address decoders 330, 325, respectively. A read/write multiplexer 315, coupled to a data in/out buffer 340, is utilized to selectively read or write data to the memory cells, depending on whether a READ or WRITE command was received by memory array controller 335.

Memory array 300 also includes a failure detection circuit 350 that includes an inverter 355 and a register 360 that are coupled to data in/out buffer 340. Inverter 355 and register 360 also provide inputs to a comparator 365. Comparator 365 is utilized to compare the two sets of data from inverter 355 and register 360 to generate an error signal in the event that the two sets of data are not identical. An error detection circuit 370 is also shown coupled to the output of row address decoder 330 and is utilize to monitor the operation of row address decoder 330. It should be noted that the support logic, such as column address decoders 325, data in/out buffers 340, etc., have internal conventional self-checking logic and, in an advantageous embodiment, provide an error signal in response to detecting a failure in their respective circuits.

The output of error detection circuit 370, along with an error signal output from memory array controller 335 are utilized in a first OR gate 375 that consolidate both error signals in a single support and control logic error signal. The support and control logic error signal along with the error signal from failure detection circuit 350 are, in turn, utilized as inputs to a second OR gate 380 to provide a chipkill signal that indicates a hard failure in memory array 300. This chipkill signal, may then be employed by a system utilizing memory array 300, such as memory system 200, to initiate corrective measures.

Figure 4:
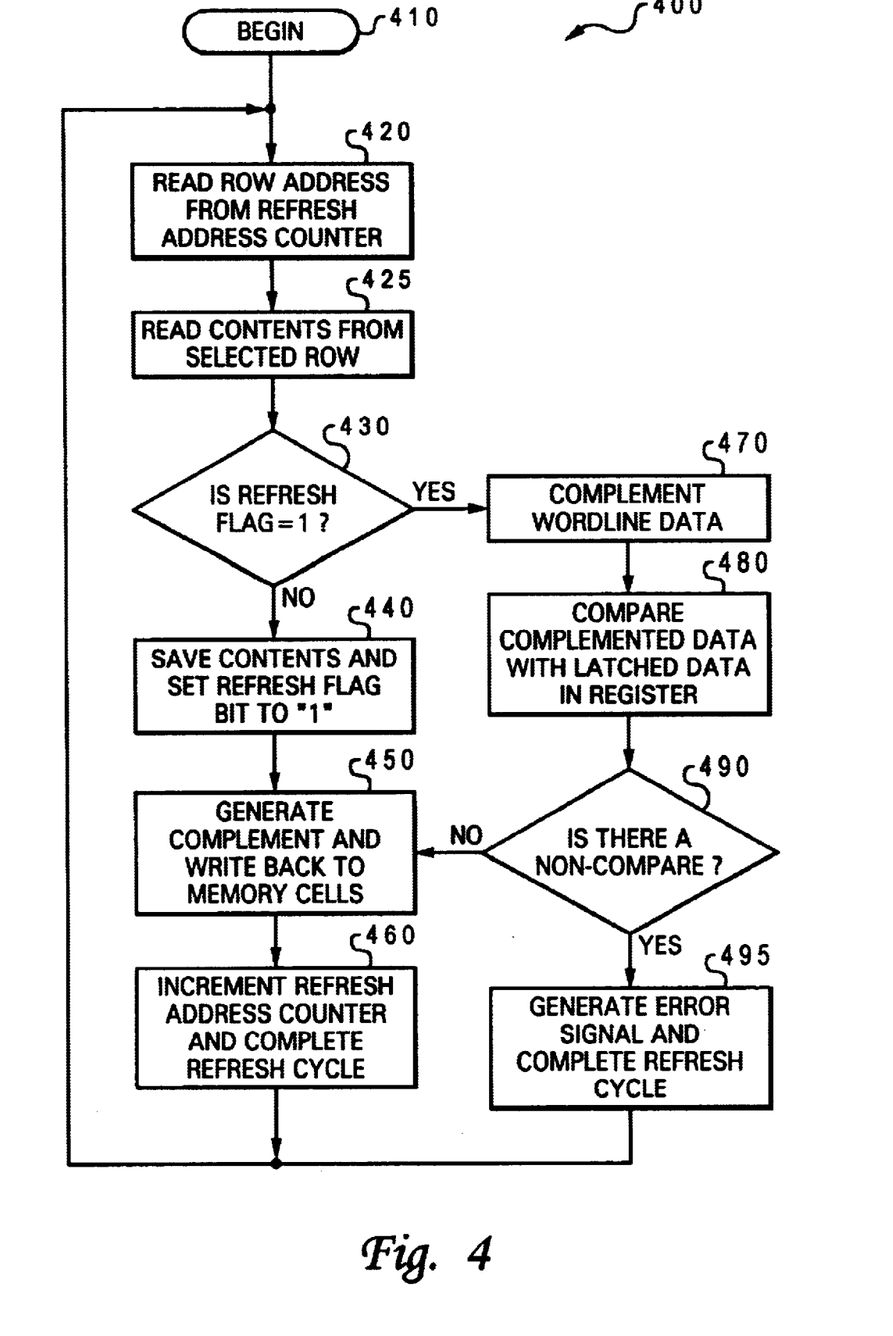
FIG. 4 illustrates a high-level flowchart of an embodiment of a failure detection process utilized by the memory array depicted in FIG. 3.

Referring now to FIG. 4, with continuing reference to FIG. 3, there is depicted a high-level flowchart of an embodiment of a failure detection process 400 utilized by memory array 300. Process 400 is initiated, as illustrated in step 410, when a refresh operation is initiated by a preset timer, or alternatively, by an external command from a user. After the refresh has been initiated, the row address of a first row of cells in memory array 300 to be refreshed is obtained from a refresh address counter (not shown), as depicted in step 420. The refresh address counter is typically a part of memory array controller 435 and, unlike conventional refresh address counters, includes an additional bit, i.e., a refresh flag bit, designated to be the least significant bit (LSB) that provides a mechanism which will allow the selection of the same wordline, i.e., row of cells, twice in two sequential refresh cycles. For example, if the refresh flag bit is zero, this will indicate that the selected row of cells has not been read in the last refresh cycle. If the refresh flag bit is set to one, on the other hand, this will indicate that this particular row of cells has been read in the last refresh cycle. Similarly, the wordline has an additional bit, i.e., complement flag bit, to indicate whether the data is the original data or a complemented copy of the original data.

Next, the contents in a row of cells is read out to data in/out buffer 340, as depicted in step 425. As illustrated in decisional step 430, the refresh flag bit in the refresh address counter is evaluated to determine its content. If the refresh flag bit is set to zero, i.e., indicating that this is the first read operation for this particular row of cells, the contents in the selected row of cells are saved in register 360, as illustrated in step 440. Additionally, the refresh flag bit is next set to "1." In another advantageous embodiment, a segment of the wordline data is stored in register 360. It should be noted, however, that for n segments, the normal refresh rate would have to be increased n times. Next, as depicted in step 450, the wordline remains selected as the data is inverted at inverter 355 to generate a complement of the data. The complement of the data is then written back to the selected row of cells and the complement flag bit is toggled, i.e., if the complement flag bit is "0," it is changed to "1" and vice versa.

After the complemented data has been written back to the selected row of cells, the refresh address counter is incremented by one and the refresh cycle is completed as in a conventional DRAM refresh operation, as illustrated in step 460. Process 400 is then repeated at the issuance of the next refresh command, beginning at step 420.

Returning back to decisional step 430, if the refresh flag bit is set to "1" indicating that this is the second refresh of the same address, i.e., row of cells, the data on the wordline is complemented and the complement flag bit is toggled utilizing inverter 355, as depicted in step 470. Next, as illustrated in step 480, the complemented data from step 470 (designated X) is compared with the latched data (designated Y) stored in register 360, from the previous refresh operation of this row of cells, utilizing comparator 365. Subsequently, as depicted in decisional step 490, it is determined if the two sets of data, i.e., X and Y, are equal. The value of X should equal the value of Y because of the two intervening inversions. However, if memory array 300 has suffered a hard failure such that a bit, i.e., memory cell, has its output value stuck either high or low regardless of the value written to that memory cell, then X will not be equal to Y. In an advantageous embodiment, comparator 365 utilizes EXclusive OR (EXOR) logic to compare the two sets of data. In the event that the two sets of data are not equal, an error signal indicating a failed memory array is generated and the refresh cycle is completed as in a conventional DRAM refresh operation, as illustrated in step 495. Process 400 is then repeated at the issuance of the next refresh command, beginning at step 420.

On the other hand, if both sets of data are equal, process 400 resumes at step 450, where the data is inverted at inverter 355 to generate a complement of the data, thus restoring the data to its original value. The restored data is then written back to the selected row of cells and the complement flag bit is toggled to "0." After the restored data has been written back to the selected row of cells, the refresh address counter is incremented by one and the refresh cycle is completed as in a conventional DRAM refresh operation, as illustrated in step 460. Process 400 is then repeated for the next row of cells in memory array 300 at the issuance of the next refresh command, beginning at step 420.

Figure 5:
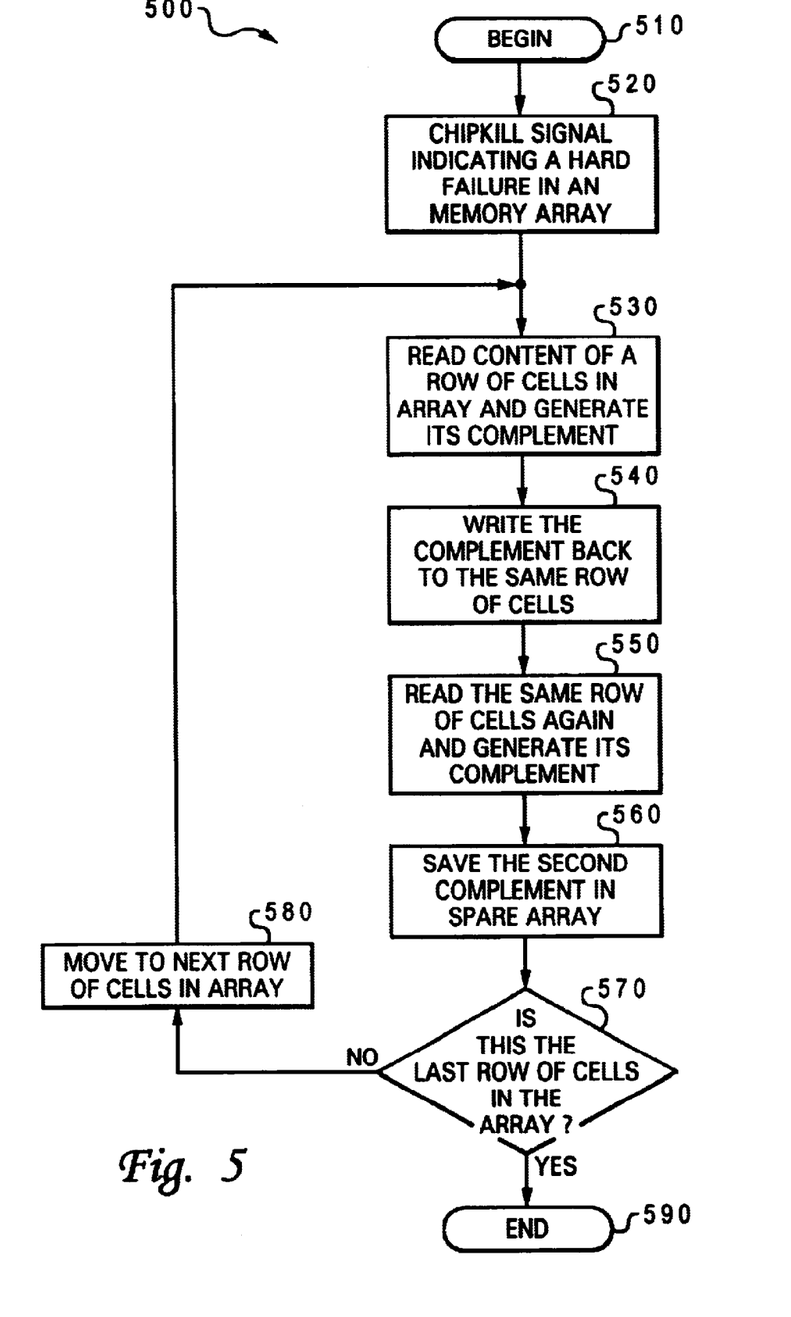
FIG. 5 illustrates a high-level process flow of an embodiment of an error detection and correction scheme according to the principles disclosed by the present invention.

The utilization of the fault tolerant memory system of the present invention will hereinafter be described in greater detail with respect to FIG. 5 that illustrates a high-level process flow 500 of an embodiment of a error detection and correction scheme according to the principles disclosed by the present invention. Process 500 is initiated, as depicted in step 510, when a memory array, e.g., first memory array 212a depicted in FIG. 2, incurs a hard error. Consequently, a chipkill signal will be generated by memory array 212a and placed on first error signal line 270a, as illustrated in step 520. Following the detection of a hard failure in memory array 210a, the correction logic, i.e., R/C/W/R/C logic, in error detection and correction logic 230 will initiate a data restoration process. As depicted in step 530, process 500 begins by reading the contents beginning with the first row of cells in the failed memory array; in this case, memory array 210a. The read data is then inverted, i.e., complemented. The resulting complemented data is then written back to the first row of cells, as illustrated in step 540. The complemented data in the first row of cells are again read and another inverting operation is performed to generate a second complement of the data stored in the first row of cells, as depicted in step 550.

The resulting recomplemented data following the second inverting operation will be the correct data, even if a problem, e.g., stuck bits, causing the memory array failure is present in the first row of cells. For a greater understanding and explanation of the data restoration process utilizing the above-discussed R/C/W/R/C operation, see copending U.S. patent application entitled "A HIGH PERFORMANCE FAULT TOLERANT MEMORY SYSTEM UTILIZING GREATER THAN FOUR-BIT DATA WORD MEMORY ARRAYS." Following the second inverting operation, the recomplemented data is then written to the first row of cells in spare memory array 260, as illustrated in step 560.

Next, as depicted in decisional step 570, process 500 determines if the contents in all of the row of cells in memory array 210a have been subjected to the data correction, i.e. R/C/W/R/C logic, scheme. If process 500 determines that the last read row of cells is not the last row of cells in memory array 210a, the data restoration process is repeated beginning at step 530 for the next row of cells in memory array 210a, as illustrated in step 580. On the other hand, if process 500 determines that all the row of cells in the failed memory array have been read and the resulting "restored" data have been saved in spare memory array 260, process 500 is terminated, as depicted in step 590.

Following the completion of process 500, the address of the failed memory array is saved in register 240. Subsequently, prior to accessing a memory array for a read or write operation, the address of the desired memory array is compared with the saved failed memory array address in register 240 utilizing comparator 250. In the event that the two addresses match, the address of spare memory array 260 will be substituted for the failed memory array address. Consequently, any read or write request to the failed memory array will be redirected to spare memory array 260 instead.

In another advantageous embodiment, processes 400 and 500 may be implemented in a data processing system employing the fault tolerant memory system disclosed by the present invention and programmed to execute the methods described hereinabove. Accordingly, in an advantageous embodiment, sets of instructions for executing the methods disclosed herein are resident in RAM of one or more of the data processing system. These instructions may reside in various types of signal-bearing media. In this respect, one aspect of the present invention concerns a programmed product that includes signal-bearing media tangibly embodying a program of machine-readable instructions executable by a digital data processor to perform the error detection and correction methods described above. The present invention does not contemplate limiting its practice to any particular type of signal-bearing media, i.e., computer readable medium, utilized to actually carry out the distribution. Examples of signal-bearing media includes recordable type media, such as floppy disks and hard disk drives, and transmission type media such as digital and analog communication links and wireless. In other advantageous embodiments, the computer program product may also be stored at another computer and transmitted to a user's computer system by an internal or external communication network, e.g., LAN or WAN, respectively.

While the invention has been particularly shown and described with reference to a preferred embodiment, it will be understood by those skilled in the art that various changes in form and detail may be made therein without departing from the spirit and scope of the invention.

What is claimed is:

1. A fault tolerant memory system, comprising:
   a plurality of memory arrays including at least one spare memory array, each of said plurality of memory arrays having an internal error detection circuit;
   means for replacing a failed memory array with said spare memory array; and
   data correction logic, coupled to said plurality of memory arrays, for correcting data stored in the failed memory array and for transferring said corrected data to said spare memory array.

2. The fault tolerant memory system as recited in claim 1, wherein each of said internal error detection circuits includes:
   an inverter;
   a register coupled to said inverter; and
   a comparator, coupled to said inverter and said register, for comparing contents of said inverter and said register and generating an error signal in response to said contents not being equal to indicate a failed memory array.

3. The fault tolerant memory system as recited in claim 2, wherein said internal error detection circuits are utilized during refresh operations of said plurality of memory arrays.

4. The fault tolerant memory system as recited in claim 1, wherein each of said plurality of memory arrays is a dynamic random access memory (DRAM).

5. The fault tolerant memory system as recited in claim 1, wherein data correction logic includes:
   means for reading content of a row of cells in said failed memory array and generating a first complement of said content;
   means for writing said first complement to back to said row of cells; and
   means for reading said first complement from said failed memory array and generating a second complement of said first complement.

6. The fault tolerant memory system as recited in claim 1, wherein said means for replacing a failed memory array with said spare array includes means for saving the address of said failed memory array in a register.

7. The fault tolerant memory system as recited in claim 6, wherein said means for replacing a failed memory array with said spare array further includes:
   means for comparing the address of said failed memory array with a memory array address of a memory access operation; and
   means for directing said memory access operation to said spare memory array in response to said address of said failed memory array being equal to said memory array address of said memory access operation.

8. A method for identifying and replacing a failed memory array in a memory system having a plurality of memory arrays including a spare memory array, comprising:

utilizing memory arrays having internal error detection circuits;

replacing a failed memory array with said spare memory array; and correcting data stored in a failed memory array in response to a hard failure detection in said failed memory array and for transferring said corrected data to said spare memory array.

9. The method as recited in claim 8, wherein said correcting data stored in a failed memory array includes:
  (a) reading content of a first row of cells in said failed memory array and generating a first complement of said content;
  (b) writing said first complement back to said first row of cells;
  (c) reading said first complement from said failed memory array and generating a second complement of said first complement;
  (d) writing said second complement to a first row of cells in said spare memory array; and
  (e) repeating (a) through (d) for all row of cells in said memory array.

10. The method as recited in claim 8, wherein said substituting said spare memory array for said failed memory array includes of saving the address of said memory array in a register.

11. The method as recited in claim 10, wherein said substituting said spare memory array for said failed memory array further includes:
  comparing the address of said failed memory array with a memory array address of a memory access operation; and
  directing said memory access operation to said spare memory array in response to said address of said failed memory array being equal to said memory array address of said memory access operation.

12. The method as recited in claim 8, wherein each of said plurality of memory arrays is a dynamic random access memory (DRAM).

13. The method as recited in claim 8, wherein said internal error detection circuits are utilized during refresh of said plurality of memory arrays.

14. The method as recited in claim 8, wherein each of said internal error detection circuits includes:
  an inverter;
  a register coupled to said inverter; and
  a comparator, coupled to said inverter and said register, for comparing contents of said inverter and said register and generating an error signal in response to said contents not being equal to indicate a failed memory array.

15. A computer program product, comprising:
  a computer-readable medium having stored thereon computer executable instructions for implementing a method for identifying and replacing a failed memory array in a memory system having a plurality of memory arrays including a spare memory array, said computer executable instructions when executed, perform the steps of:
    utilizing memory arrays having internal error detection circuits;
    replacing a failed memory array with said spare memory array; and
    correcting data stored in a failed memory array in response to a hard failure detection in said failed memory array and transferring said corrected data to said spare memory array.

16. The computer program product as recited in claim 15, wherein said correcting data stored in a failed memory array includes:
  (a) reading content of a first row of cells in said failed memory array and generating a first complement of said content;
  (b) writing said first complement back to said first row of cells;
  (c) reading said first complement from said failed memory array and generating a second complement of said first complement;
  (d) writing said second complement to a first row of cells in said spare memory array; and
  (e) repeating (a) through (d) for all row of cells in said memory array.

17. The computer program product as recited in claim 15, wherein said substituting said spare memory array for said failed memory array includes of saving the address of said memory array in a register.

18. The computer program product as recited in claim 17, wherein said substituting said spare memory array for said failed memory array further includes:
  comparing the address of said failed memory array with a memory array address of a memory access operation; and
  directing said memory access operation to said spare memory array in response to said address of said failed memory array being equal to said memory array address of said memory access operation.

19. The computer program product as recited in claim 15, wherein each of said plurality of memory arrays is a dynamic random access memory (DRAM).

20. The computer program product as recited in claim 15, wherein said internal error detection circuits are utilized during refresh of said plurality of memory arrays.

21. The computer program product as recited in claim 15, wherein each of said internal error detection circuits includes:
  an inverter;
  a register coupled to said inverter; and
  a comparator, coupled to said inverter and said register, for comparing contents of said inverter and said register and generating an error signal in response to said contents not being equal to indicate a failed memory array.

* * * * *